(12) United States Patent
Hekmatshoartabari et al.

(10) Patent No.: US 9,178,042 B2
(45) Date of Patent: Nov. 3, 2015

(54) CRYSTALLINE THIN-FILM TRANSISTOR

(71) Applicant: INTERNATIONAL BUSINESS MACHINES CORPORATION, Armonk, NY (US)

(72) Inventors: Bahman Hekmatshoartabari, White Plains, NY (US); Ning Li, White Plains, NY (US); Devendra K. Sadana, Pleasantville, NY (US); Davood Shahrjerdi, White Plains, NY (US)

(73) Assignee: GLOBALFOUNDRIES INC, Grand Cayman (KY)

( * ) Notice: Subject to any disclaimer, the term of this patent is extended or adjusted under 35 U.S.C. 154(b) by 0 days.

(21) Appl. No.: 13/736,534

(22) Filed: Jan. 8, 2013

(65) Prior Publication Data
US 2014/0191320 A1   Jul. 10, 2014

(51) Int. Cl.
H01L 27/11 (2006.01)
H01L 27/108 (2006.01)
H01L 21/316 (2006.01)
H01L 29/66 (2006.01)
H01L 29/786 (2006.01)
H01L 33/00 (2010.01)

(52) U.S. Cl.
CPC .... *H01L 29/66742* (2013.01); *H01L 29/66772* (2013.01); *H01L 29/786* (2013.01); *H01L 29/78654* (2013.01); *H01L 29/78675* (2013.01); *H01L 33/0041* (2013.01)

(58) Field of Classification Search
USPC ....................................................... 257/347
See application file for complete search history.

(56) References Cited

U.S. PATENT DOCUMENTS

| 5,658,805 | A |   | 8/1997 | Young |
|---|---|---|---|---|
| 5,766,344 | A |   | 6/1998 | Zhang et al. |
| 5,814,835 | A | * | 9/1998 | Makita et al. ............... 257/64 |
| 6,093,577 | A | * | 7/2000 | van der Groen .... G02F 1/13454 257/E21.122 |
| 6,093,934 | A | * | 7/2000 | Yamazaki et al. ............ 257/51 |
| 6,444,506 | B1 |   | 9/2002 | Kusumoto et al. |
| 6,576,534 | B1 | * | 6/2003 | Zhang et al. ............... 438/486 |
| 6,713,329 | B1 |   | 3/2004 | Wagner et al. |
| 6,731,064 | B2 |   | 5/2004 | Andry et al. |
| 6,734,505 | B2 |   | 5/2004 | Suzuki et al. |
| 6,788,376 | B2 | * | 9/2004 | Izumi et al. ............... 349/139 |
| 7,109,075 | B2 |   | 9/2006 | Yeh et al. |
| 7,199,397 | B2 |   | 4/2007 | Huang et al. |
| 7,253,040 | B2 | * | 8/2007 | Itoga et al. ............... 438/155 |

(Continued)

OTHER PUBLICATIONS

E. Chen, "III. Wet and Dry Etching", Harvard University, Applied Physics 298r, Apr. 12, 2004, pp. 1-18; http://www.mrsec.harvard.edu/education/ap298r2004/Erli%20chen%20Fabrication%20III%20-%20Etching.pdf.*

(Continued)

*Primary Examiner* — Jarrett Stark
*Assistant Examiner* — Charles N Ausar-El
(74) *Attorney, Agent, or Firm* — Tutunjian & Bitetto, P.C.

(57) ABSTRACT

A method for forming a thin film transistor includes joining a crystalline substrate to an insulating substrate. A doped layer is deposited on the crystalline substrate, and the doped layer is patterned to form source and drain regions. The crystalline substrate is patterned to form an active area such that a conductive channel is formed in the crystalline substrate between the source and drain regions. A gate stack is formed between the source and drain regions, and contacts are formed to the source and drain regions and the gate stack through a passivation layer.

20 Claims, 6 Drawing Sheets

(56) References Cited

U.S. PATENT DOCUMENTS

| | | | |
|---|---|---|---|
| 7,300,829 | B2 | 11/2007 | Hsiao et al. |
| 7,732,301 | B1 | 6/2010 | Pinnington et al. |
| 7,915,114 | B2 | 3/2011 | Hsiao et al. |
| 8,169,024 | B2* | 5/2012 | Cheng et al. ............... 257/347 |
| 8,198,634 | B2* | 6/2012 | Yoon et al. ............... 257/72 |
| 8,232,552 | B2* | 7/2012 | Yano et al. ............... 257/43 |
| 8,319,217 | B2* | 11/2012 | Kim et al. ............... 257/43 |
| 8,357,974 | B2* | 1/2013 | Mohamed et al. ............ 257/347 |
| 8,431,929 | B2* | 4/2013 | Fang et al. ............... 257/59 |
| 8,482,008 | B2* | 7/2013 | Arai et al. ............... 257/59 |
| 8,941,114 | B2* | 1/2015 | Yamazaki et al. ............... 257/59 |
| 2003/0134487 | A1* | 7/2003 | Breen ............... H01L 51/0001 438/455 |
| 2005/0045889 | A1 | 3/2005 | Fryer et al. |
| 2005/0206001 | A1* | 9/2005 | Kawai ............... 257/758 |
| 2006/0111244 | A1 | 5/2006 | Gan et al. |
| 2007/0007630 | A1 | 1/2007 | Fang et al. |
| 2007/0085955 | A1 | 4/2007 | Kimura |
| 2007/0128786 | A1 | 6/2007 | Cheng et al. |
| 2008/0087960 | A1* | 4/2008 | Hsiao et al. ............... 257/347 |
| 2008/0129195 | A1 | 6/2008 | Ishizaki et al. |
| 2010/0244185 | A1 | 9/2010 | Takafuji et al. |
| 2011/0121305 | A1 | 5/2011 | Tseng |
| 2013/0089954 | A1* | 4/2013 | Ro ............... H01L 51/003 438/113 |
| 2013/0299910 | A1 | 11/2013 | Cheng et al. |
| 2013/0328110 | A1* | 12/2013 | Hekmatshoar-Tabari et al. ............... 257/256 |

OTHER PUBLICATIONS

Sazonov, A., et al. "Low Temperature A-SI:H TFT on Plastic Films: Materials and Fabrication Aspects" Proceedings of the 23rd International Conference on Microelectronics (MIEL 2002), vol. 2. May 2002. pp. 525-528.

Sazonov, A., et al. "Low Temperature Materials and Thin Film Transistors for Flexible Electronics" Proceedings of the IEEE, vol. 93, No. 8. Aug. 2005. pp. 1420-1428.

Long, et al., "Active-Matrix Amorphous-Silicon TFT Arrays at 180 degC on Clear Plastic and Glass Substrates for Organic Light-Emitting Displays", IEEE Transactions on Electron Devices, Aug. 2006, vol. 53, No. 8.

Office Action mailed on Oct. 9, 2013 for U.S. Appl. No. 13/967,128.

Office Action mailed for U.S. Appl. No. 13/967,128, mailed Aug. 14, 2014. (12 pages).

Final Office Action mailed on Apr. 24, 2014 for U.S. Appl. No. 13/967,128.

Office Action dated Feb. 10, 2015 for U.S. Appl. No. 13/967,128.

U.S. Office Action mailed May 15, 2015 in U.S. Appl. No. 13/967,128.

* cited by examiner

CRYSTALLINE THIN-FILM TRANSISTOR

BACKGROUND

1. Technical Field

The present invention relates to display devices, and more particularly to thin film transistors having a crystalline channel that meets low-temperature processing requirements of low-cost and/or flexible substrates.

2. Description of the Related Art

Mainstream thin film transistor (TFT) devices are comprised of amorphous or polycrystalline materials as active channel materials. One reason for the use of such materials is that amorphous and polycrystalline materials permit large area and low cost deposition. This is particularly suitable for low-cost substrates such as glass or flexible plastic. However, the performance of these devices (particularly mobility and therefore drive current and switching speed) is limited by the non-crystalline nature of the semiconductor active material. On the other hand, high processing temperatures typically required for crystalline semiconductor materials are not compatible with low-cost substrates associated with amorphous and polycrystalline devices.

Active matrix TFT organic light emitting diode (OLED) displays employ amorphous and polycrystalline devices. Typically amorphous hydrogenated silicon (a-Si:H) or low temperature polysilicon (LTPS) TFTs are employed as a backplane. However, the mobility of a-Si:H is too low for high resolution OLED displays, and LTPS suffers from device-to-device threshold voltage ($V_T$) variation and compensation circuitry limit resolution.

SUMMARY

A method for forming a thin film transistor includes joining a crystalline substrate to an insulating substrate. A doped layer is deposited on the crystalline substrate, and the doped layer is patterned to form source and drain regions. The crystalline substrate is patterned to form an active area such that a conductive channel is formed in the crystalline substrate between the source and drain regions. A gate stack is formed between the source and drain regions, and contacts are formed to the source and drain regions and the gate stack through a passivation layer.

A method for forming a thin film transistor for displays includes joining a crystalline substrate to an insulating substrate; depositing a doped layer on the crystalline substrate; patterning the doped layer to form source and drain regions; patterning the crystalline substrate to form an active area such that a conductive channel is formed in the crystalline substrate between the source and drain regions; forming a gate stack between the source and drain regions; forming contacts to the source and drain regions and the gate stack through a first passivation layer; forming one or more metallization layers to provide lines for connecting components; and depositing and patterning a transparent conductor on the insulating substrate to form pixel electrodes.

A thin film transistor includes a crystalline substrate wafer bonded to an insulating substrate and patterned to form an active area such that a conductive channel is formed in the crystalline substrate between source and drain regions formed on the active area. A gate stack is formed between the source and drain regions. Contacts are coupled to the source and drain regions and the gate stack and formed through a passivation layer.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
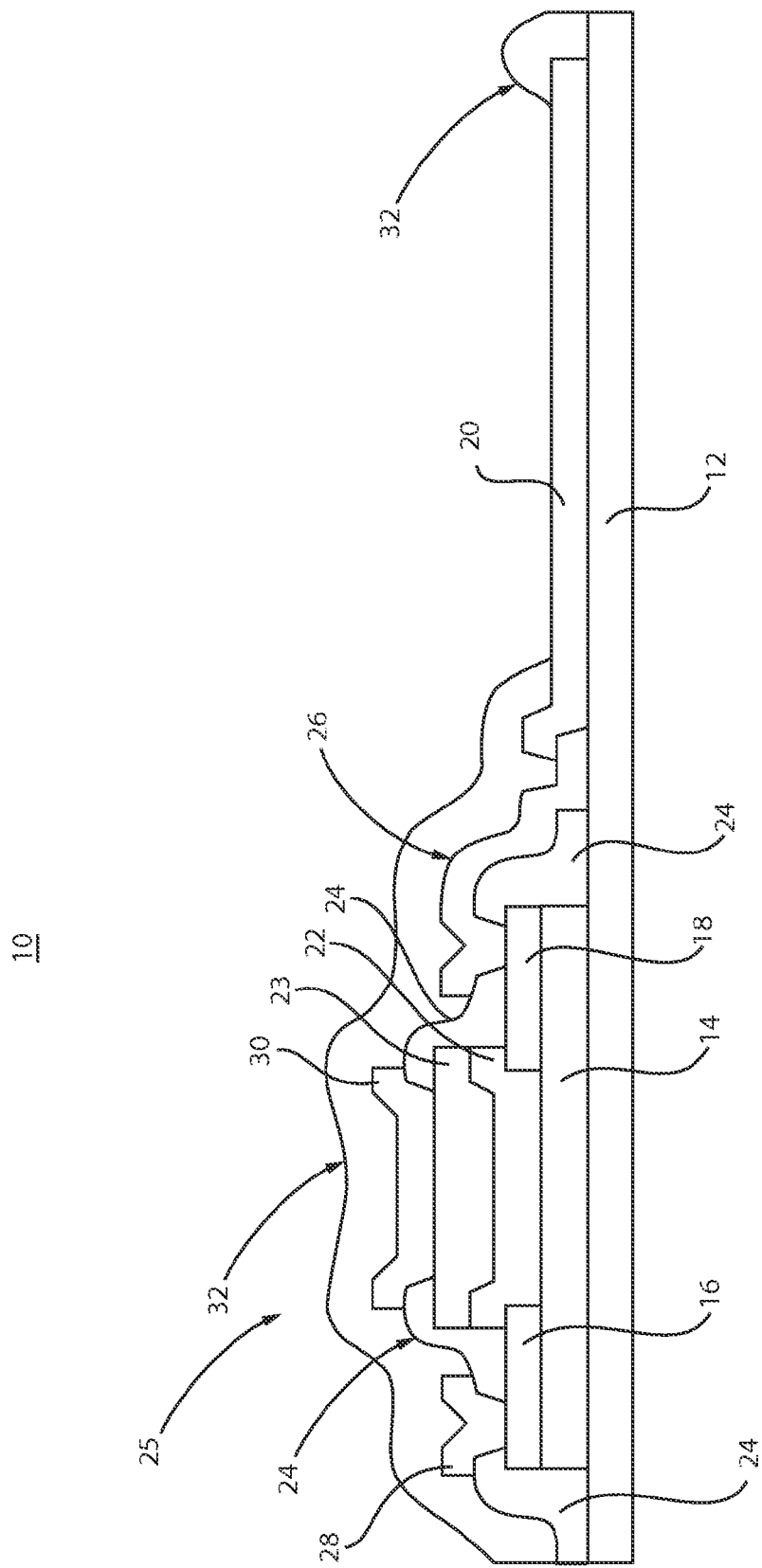
FIG. 1 is a cross-sectional view of a thin film transistor (TFT) in accordance with one illustrative embodiment.

In accordance with the present principles, devices and methods for fabrication are described that permit the use of crystalline substrate materials for thin film transistors. The use of crystalline materials, e.g., monocrystalline or multicrystalline material, permits higher carrier mobility and better operational efficiency over noncrystalline materials (e.g., amorphous or polycrystalline materials). In addition, in accordance with the present methods, costs of fabrication are maintained comparable to the costs for non-crystalline devices.

The present embodiments, enable cost effective fabrication of not only standard resolution displays, e.g., 100 dots per inch (dpi), but for high definition (HD) (about 150 dpi), microdisplays/picoprojectors (greater than 1000 dpi) and beyond. In accordance with particularly useful embodiments, crystalline substrates may be processed using layer transfer techniques to avoid expensive and high temperature CMOS (complementary metal oxide semiconductor) processing/foundry.

It is to be understood that the present invention will be described in terms of a given illustrative architecture for a display device; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit or display device may be created in a graphical computer programming language, and stored in a computer storage medium (such as a disk, tape, physical hard drive, or virtual hard drive such as in a storage access network). If the designer does not fabricate chips or displays or the photolithographic masks used to fabricate chips or displays, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the design in question that are to be formed on a wafer or substrate. The photolithographic masks are utilized to define areas of the wafer or substrate (and/or the layers thereon) to be etched or otherwise processed.

Methods as described herein may be used in the fabrication of integrated circuit chips or displays. The resulting integrated circuit chips or displays can be distributed by the fabricator in raw form, as a bare die, or in a packaged form. In any case, the chip or display is then integrated with other chips, discrete circuit elements, and/or other signal processing devices as part of either (a) an intermediate product, such as a screen, or (b) an end product, such as a display device. The end product can be any product that includes a display, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a cross-sectional view of a pixel structure 10 is shown in accordance with the present principles. The pixel structure 10 includes a thin film transistor (TFT) device 25 configured to drive a passive device such as an organic light-emitting diode (OLED) or liquid crystal (LC), by providing current and/or voltage to an electrode 20 of the passive device. The electrode 20 may be comprised of a transparent conductive material such as a transparent conductive oxide. Examples include but are not limited to indium-tin-oxide (ITO) and aluminum-doped zinc-oxide (AZO). In many displays, a pixel is comprised of three subpixels, where each subpixel handles a different color component, e.g., red, green, blue. The TFT device 25 and electrode 20 are formed on an insulating handle substrate 12. The handle substrate 12 may include a polymer material, glass or another insulating material suitable for forming TFT devices and pixels thereon. In one embodiment, the substrate 12 may include a flexible material that may be employed in flexible displays. The substrate thickness may be in a range of about 20 nm to about 2 µm, with a thicknesses in the range of between about 50-300 nm being more preferred; however, thinner or thicker substrates may be employed as well. The substrate 12 is preferably a low cost material such as glass or plastic; however, other materials such as semiconductor materials or the like may be employed.

A crystalline substrate 14 is applied to the substrate 12 by a transfer process. The transfer process may include a wafer transfer process (e.g., wafer bonding) and may include cleaving, etching adhesion or other wafer transfer techniques. The substrate 14 may be bonded to the substrate 12 using adhesives, or the substrate 12 (e.g., a silicon oxide, silicon nitride or the like) may be grown on a thick substrate and cleaved along a crystal plane to form the substrate 14, e.g., spalling, smart cut, epitaxial layer lift-off (ELO), etc. In one particularly useful embodiment, the substrate 14 includes monocrystalline Si, although other monocrystalline or multi or polycrystalline materials may be employed. Other substrate materials may include, e.g., SiGe, Ge, GaAs, etc. The substrate 14 may be doped prior to wafer/layer transfer.

Source and drain regions 16, 18 are formed on the substrate 14, and may form a homojunction or a heterojunction. The source and drain regions 16, 18 may be deposited epitaxially using a low temperature process. In one embodiment, the deposition process includes a plasma enhanced chemical vapor deposition (PECVD) process, at a temperature below about 400 degrees C. and preferably at a temperature between about 150 to about 250 degrees C., and more preferably below 200 degrees C. The source and drain regions 16, 18 may be selectively grown on the substrate 14 and doped later using appropriate masking techniques. The source and drain regions 16, 18 may be deposited in amorphous, nanocrystalline, microcrystalline or crystalline form, patterned and doped later or grown and doped in-situ. The source and drain regions 16, 18 may include Si and, in particular, hydrogenated Si in a noncrystalline form (e.g., amorphous, nanocrystalline, microcrystalline).

The source and drain regions 16, 18 may be spaced apart to form channel regions having a length, L, and width, W. Since crystalline material is employed for substrate 14, carrier mobility is increased. This permits the use of smaller W and/or longer L devices. In particularly useful embodiments, a W/L ratio is less than 25 and more preferably less than 5.

The smaller W leads to better display resolution (more dpi). The longer L reduces lithography costs (a larger dimension is easier to process). Increased mobility also can reduce power consumption as operation voltages can be reduced.

A gate stack is formed, which includes the formation and patterning of a gate dielectric 22. The gate dielectric 22 preferably includes a high dielectric constant (high-k) material where the dielectric constant is greater than the dielectric constant of silicon dioxide. Such materials may include hafnium dioxide, silicon oxynitride, zirconium dioxide, titanium dioxide, tantalum oxide, etc. The gate stack further includes a gate conductor 23, which may include a metal or other conductive material. The gate conductor 23 may include, e.g., aluminum, chromium, molybdenum, nickel, titanium-nitride, etc. or combinations of materials. The gate stack is patterned to properly size the gate dimensions.

A dielectric layer 24 is formed over the TFT device 25 and is patterned to open up holes for contacts 26, 28 and 30. The contacts 28 and 26 connect to the source and drain regions 16, 18 and the contact 30 connects to the gate conductor 23. The dielectric layer 24 may include a silicon oxide or silicon nitride although other materials may be employed. The contacts 26, 28 and 30 may include a metal such as aluminum, chromium, molybdenum, copper, doped polysilicon, etc.

A transparent conductive material is deposited and patterned to form electrode 20. The transparent conductive material may include indium tin oxide, although other transparent conductors, such as, aluminum-doped zinc oxide, fluorine doped tin oxide, etc. The electrode 20 connects to the contact 26. A passivation layer 32 is formed over the TFT device 25 and the electrode 20 and then is removed from portions of the electrode 20 using a masked etch. The passivation layer 32 may include a dielectric material (e.g., silicon dioxide, etc.). The passivation layer 32 also serves to provide edge planarization for the electrode 20.

Figure 2:
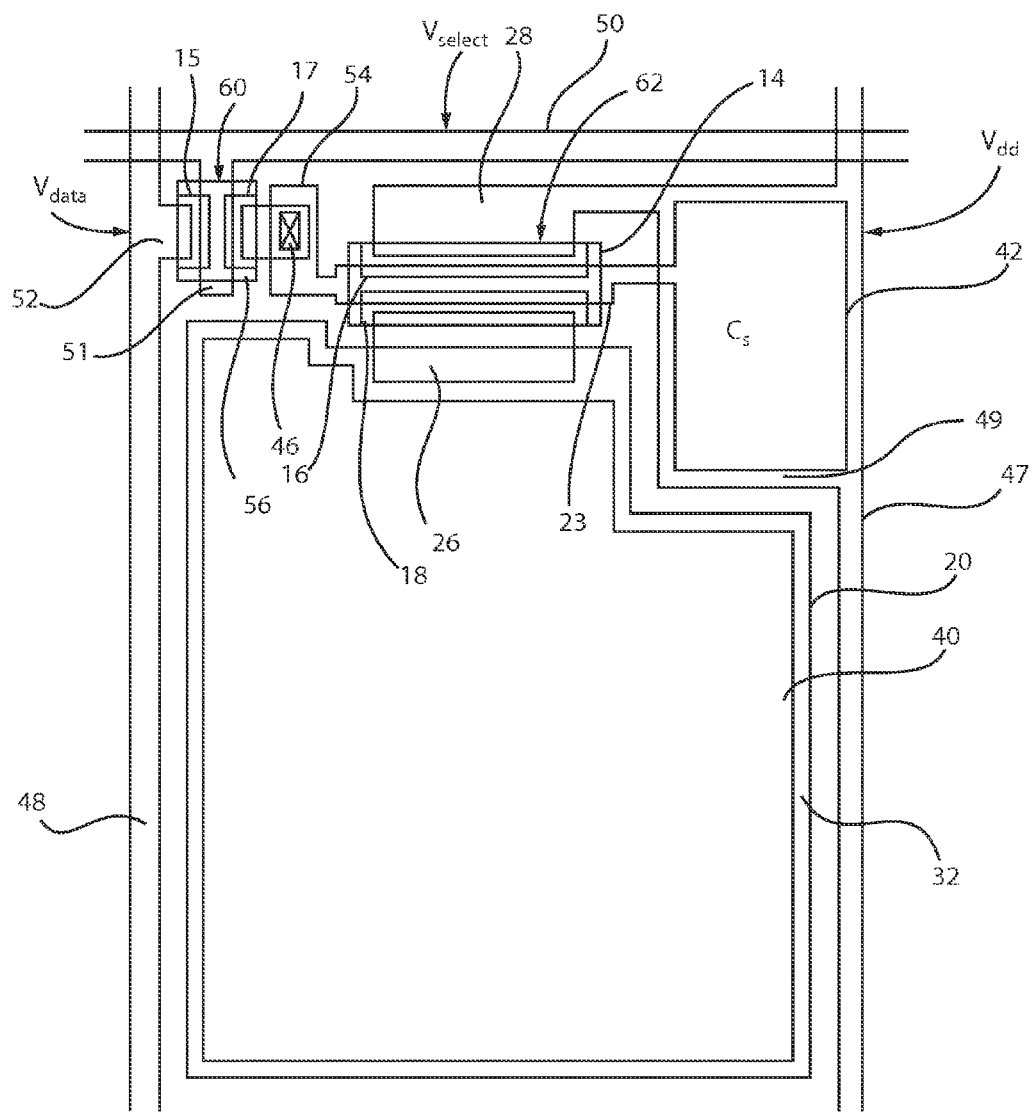
FIG. 2 is a plan view of an active-matrix organic light-emitting diode (AM-OLED) pixel circuit in accordance with one illustrative embodiment.

It should be understood that during processing of the TFT device 25, other TFT devices and/or pixel structures may also be formed. These may include a switching transistor (TFT), contacts, capacitors, etc. FIG. 2 provides a top view of an illustrative pixel cell having an organic light emitting diode (OLED) structure in accordance with one embodiment. The structure in accordance with FIG. 1 may include a liquid crystal display (LC) structure since the basic structure has many commonalities with the OLED structure of FIG. 2. Some of the elements of FIG. 2 are labeled with the same find numerals as employed in FIG. 1.

Referring to FIG. 2 with continued reference to FIG. 1, a top schematic view of a pixel (or subpixel) cell 200 is shown in accordance with another illustrative embodiment. A driver TFT device 62 includes the structure of TFT device 25 of FIG. 1. In one embodiment, a single layer transfer is performed, and the transferred layer is patterned to form the substrate 56 and 14 for a switching TFT 60 and the driver TFT 62, respectively. However, it is possible that the substrates 56 and 14 are formed by two separate layer transfers which may include different materials. Source and drain regions 16, 18, 15 and 17 are formed on the respective substrates 14 and 56. The contact vias from metallization layer M1 to source and drain regions 16, 18, 15 and 17 are not shown. The source and drain regions 16, 18, 15 and 17 are contacted during conductive deposition processes (e.g., M1 or M2 metallization).

In the illustrative embodiment shown, data line 48, power line 47, interconnects 52, 26, 28 and a capacitor plate 49 are formed during M1 metallization. In addition, an address or select line 50, switching TFT gate conductor 51, interconnect 54, driver TFT gate conductor 23 and capacitor plate 42 are formed during M2 metallization. A via 46 is formed between M1 and M2 from M2 material. In the illustrative examples of FIGS. 1 and 2, the transparent conductor layer forming electrode 20 and the source 18 of the driver TFT 14 are in electrical contact by the direct overlapping of the interconnect line 26 (which is connected to the source 18 of the driver TFT 14) and the electrode 20. An electrical contact may be made through a via as well.

A transparent conductor plate 20 (corresponding to electrode 20 of FIG. 1) is connected to the driving transistor 62. The transparent conductor plate 20 is preferably formed from the transparent conductive material (e.g., indium tin oxide, etc.) and patterned as described above. A passivation layer 32 (corresponding to layer 32 in FIG. 1) is then deposited and patterned to form the opening 40 on the conductive electrode 20. An emissive electroluminescent material (not shown) and another conductive plate (not shown) are then deposited to form an OLED at the opening 40 where the electroluminescent material is in direct contact with electrode 20. The emissive electroluminescent layer is a film of an organic compound which emits light in response to an electric current. At least one of the two conductive electrodes or plates is transparent.

Figure 3A:
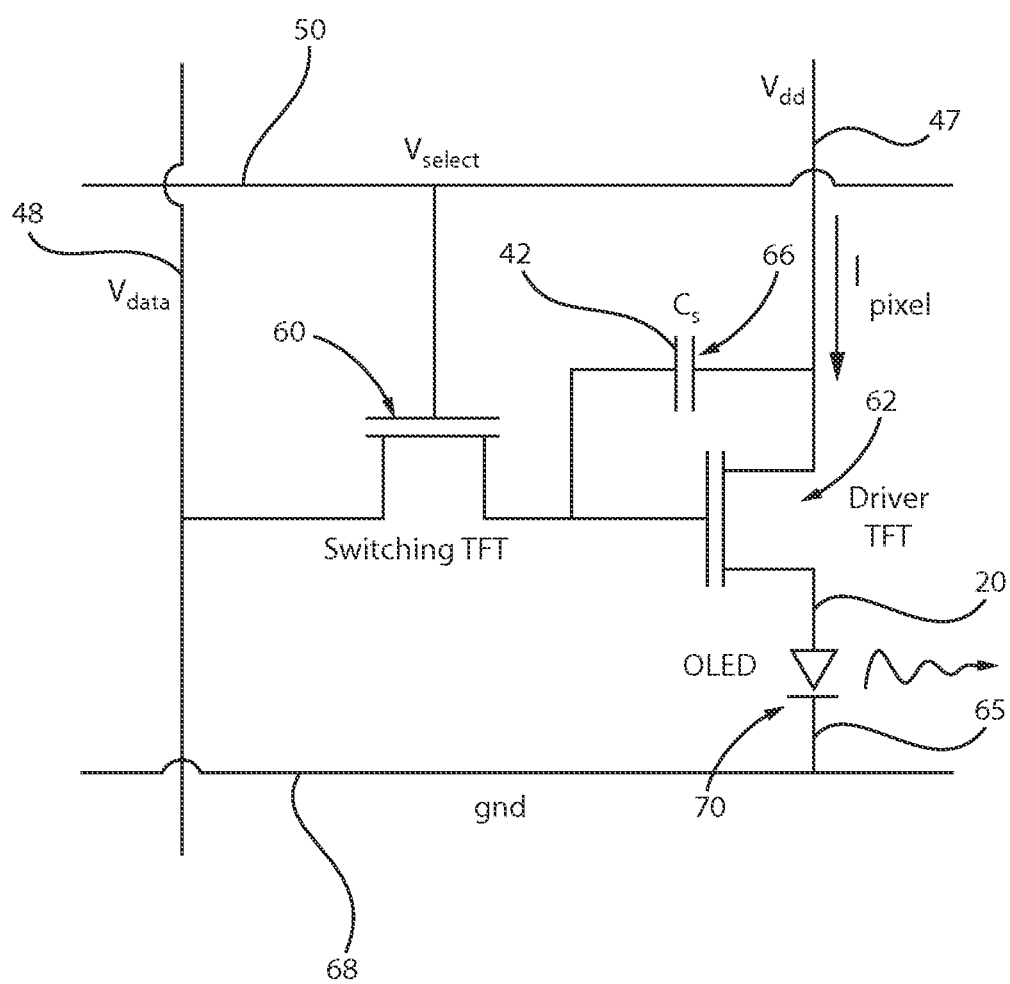
FIG. 3A is a schematic circuit diagram of the AM-OLED pixel circuit of FIG. 2 in accordance with one illustrative embodiment.

Referring to FIG. 3A, a schematic diagram of the device 200 is shown. FIG. 3A shows connections between the switching TFT 60, a capacitor 66 (having the plates 42 and 49 shown in FIG. 2) and the driver TFT 62. The switching TFT 60 provides voltage to the gate of the driver TFT 62, which in turn drives an OLED 70 by providing current to the OLED 70. The OLED includes electroluminescent material disposed between plates or electrodes 20 and 65. The electrode 65 is grounded to a ground line 68. The data line 48 provides $V_{data}$ through the switching TFT 60 to the driver TFT 62 in accordance with a select signal ($V_{select}$) on the select line 50. The power line 47 includes a supply voltage ($V_{dd}$) and provides current for operating the pixel (OLED 70) using the capacitor ($C_s$) 66. It should be understood that a similar schematic may be employed for a liquid crystal display (LCD) where the organic material of the OLED 70 is replaced by liquid crystal between the electrodes 20 and 65.

Figure 3B:
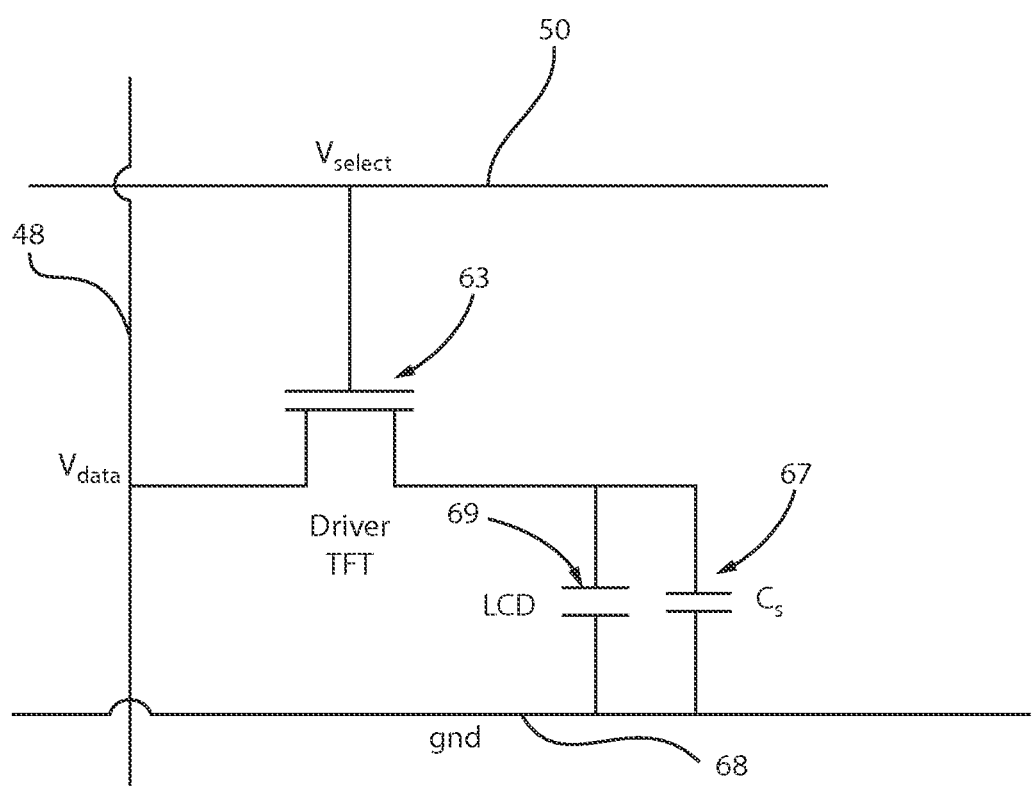
FIG. 3B is a schematic circuit diagram showing an active-matrix liquid crystal (LC) pixel circuit in accordance with another illustrative embodiment.

Referring to FIG. 3B, a schematic diagram of the device 201 is shown. The device 201 employs liquid crystal (LC). Only one TFT, a driver TFT 63 is provided for driving the LC 69 since LCs are driven by voltage, rather than by current. The TFT 63 includes crystalline channel materials. A capacitor (Cs) 67 is connected across the LC 69. In addition to or instead of OLED, LC, etc., other passive elements such as a piezoresistive or bio-sensing elements may also be employed between the electrodes 20 and 65 to implement other forms of active matrices, such as an active matrix pressure sensor, bio-sensor, etc.

Referring to FIGS. 4-9, cross-sectional views of fabrication steps for the device 10 (and/or other described devices) are illustratively shown in accordance with an illustrative embodiment.

Figure 4:
FIG. 4 is a cross-sectional view showing a crystalline substrate joined to an insulating substrate by a wafer bonding technique in accordance with the present principles.

Referring to FIG. 4, substrate 14 and insulating substrate 12 are joined. This may include forming the substrate 14 on substrate 12 by a deposition process or by adhesive bonding. In other embodiments, the substrate 12 is deposited on or adhered to a larger monocrystalline substrate. A thin substrate 14 is removed by cleaving preferably along a crystal line. Cleaving may include spalling, smart cutting, ELO or other process to achieve the structure of FIG. 4.

Smart cut is similar to spalling in that it cleaves a larger substrate to achieve the substrate 14 and provide a thin crystalline layer. The layer is cleaved using bubble formation along the cleave line. Substrate 12 is attached to the larger substrate and bubbles are formed in the larger substrate by stress or other means. The substrate 14 is then separated from the larger substrate enabling the transfer of a very thin layer of crystalline material onto substrate 12. In the ELO process, a thin portion of the thick substrate which has been grown epitaxially is transferred onto substrate 12 using known techniques. Other cleaving and transfer processes may also be employed. It should be noted that the substrate 14 may be doped during formation (in-situ) and is preferably doped in advance of the transfer process but may be doped after the transfer process. In another embodiment, the thick substrate may have an insulating substrate 12 formed thereon and a back side of the thick substrate may be etched to form the thin substrate 14 on substrate 12. Wafer transfer is one technique employed to enable the use of crystalline substrates with comparable costs to other display technologies, i.e., LTPS, amorphous Si, etc.

Figure 5:
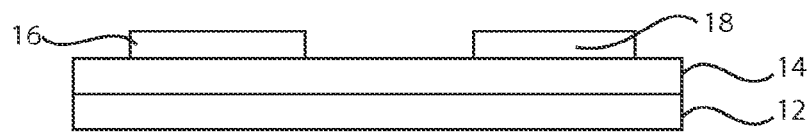
FIG. 5 is a cross-sectional view showing the structure of FIG. 4 having source/drain regions patterned on the crystalline substrate in accordance with the present principles.

Referring to FIG. 5, deposition and patterning of source and drain regions 16, 18 are performed on the substrate 14. Deposition of the source/drain regions 16, 18 may be performed by depositing a doped layer on the substrate 14, preferably using a low temperature deposition processes. Examples of low temperature deposition processes may include PECVD or hot wire CVD (HWCVD), etc., with PECVD being preferred. It is also preferably that the deposition temperature be maintained below 250 degrees C. The doped layer may include crystalline or non-crystalline materials. Crystalline may include single-crystalline or polycrystalline. Non-crystalline may include amorphous, microcrystalline, nanocrystalline materials. The doped layer may be doped (or partially doped) in-situ or ex-situ, i.e., doped after formation and patterning using appropriate masking steps. Ex-situ doping may include implantation, or diffusion doping techniques.

In a particularly useful embodiment, a PECVD (or hotwire chemical vapor deposition (HWCVD)) process is employed to selectively form a crystalline Si (or SiGe) doped layer on top of exposed portions of the substrate 14, although non-crystalline morphologies may be formed as well depending on the deposition parameters employed. The PECVD (or HWCVD) is preferably a low temperature process. The doped layer may include a Si containing layer, a Ge containing layer, or combinations thereof. In particularly useful embodiments, the doped layer may include hydrogen content in the range of about 5-40% (atomic percent), and may include germanium (Ge), carbon (C), fluorine (F), deuterium (D), nitrogen (N) and combinations thereof. Non-crystalline refers to amorphous, nanocrystalline or microcrystalline, while crystalline refers to single crystalline or polycrystalline.

The gas source providing Si for the doped layer may include silane ($SiH_4$), other gases such as disilane ($Si_2H_6$), dichlorosilane (DCS), tetrafluorosilane ($SiF_4$) or combinations thereof may be used as well. The gas source providing Ge for Ge containing layers may include germane ($GeH_4$). In-situ p-type doping may be performed using diborane ($B_2H_6$) or trimethylboron (TMB) sources, and in-situ n-type doping may be performed using a phosphine ($PH_3$) gas source, although other dopant sources may be used as well.

In one embodiment, the selective epitaxial growth of silicon is performed in a hydrogen diluted silane environment using PECVD. The gas ratio of hydrogen gas to silane gas ($[H_2]/[SiH_4]$) at 150 degrees C. is preferably between 0 to about 1000. In particularly useful embodiments, epitaxial growth of silicon begins at a gas ratio of about 5-10. The epitaxial Si quality is improved by increasing the hydrogen dilution, e.g., to 5 or greater.

Epitaxial silicon can be grown using various gas sources, e.g., silane ($SiH_4$), dichlorosilane (DCS), $SiF_4$, $SiCl_4$ or the like. The quality of epitaxial silicon improves by increasing the dilution of hydrogen using these or other gases. For higher hydrogen dilution, smoother interfaces were produced (epitaxial silicon to crystalline silicon) and fewer stacking faults and other defects were observed.

Radio-frequency (RF) or direct current (DC) plasma enhanced chemical vapor deposition (CVD) is preferably performed at deposition temperature ranges from about room temperature to about 400 degrees C., and preferably from about 150 degrees C. to about 200 degrees C. Plasma power density may range from about 2 $mW/cm^2$ to about 2000 $mW/cm^2$. A deposition pressure range may be from about 10 mTorr to about 5 Torr.

A carrier gas such as hydrogen ($H_2$), deuterium ($D_2$), helium (He) or argon (Ar) may be used for any or all of the layers. The carrier gas may be pre-mixed with the gas sources or flowed simultaneously with the gas source at the time of growth. The gas flow ratio is preferably $[H_2]/[SiH_4]>5$. For $p^{++}$ growth (n-type substrate), Ge may be included in the doped layer. In this case, the gas flow ratio is preferably $[H_2]/([SiH_4]+[GeH_4])>5$.

After deposition, the source and drain regions 16, 18 are patterned using lithographic masking and etching.

Figure 6:
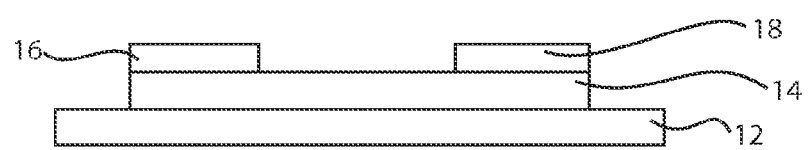
FIG. 6 is a cross-sectional view showing the structure of FIG. 5 having the crystalline substrate patterned in accordance with the present principles.

Referring to FIG. 6, etching is also employed to pattern the substrate 14 to form active areas in accordance with the source and drain regions 16, 18 and conform its dimensions to a TFT to be formed. It should be noted that the source and drain regions 16, 18 may be doped during formation (in-situ) or doped after formation (ex-situ) using appropriate masking to provide different dopant types and concentrations, as needed. The substrate 14 is patterned to form active areas or islands. These active areas form channel regions between the source and drain regions 16, 18. As such, doping of the active areas in the substrate 14 may be performed between the source and drain regions 16, 18 to form the channel in the crystalline material of substrate 14.

Figure 7:
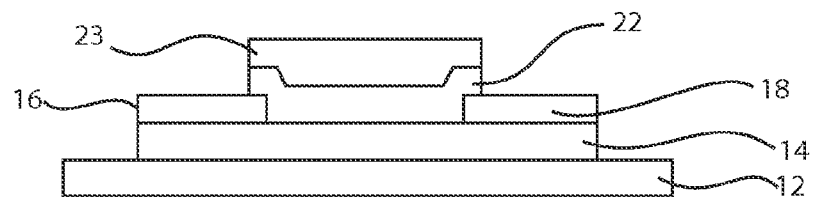
FIG. 7 is a cross-sectional view showing the structure of FIG. 6 having a gate stack formed in accordance with the present principles.

Referring to FIG. 7, a gate stack is formed between the source and drain regions 16, 18. The gate stack includes the high-k gate dielectric 22 and the gate conductor 23. The gate dielectric 22 may be deposited by an atomic layer deposition (ALD) process although other deposition processes may be employed. The gate conductor 23 may be deposited by a sputtering process or other suitable process (CVD). The gate dielectric 22 and the gate conductor 23 may be blanket deposited followed by a mask formation and selective etch to pattern both layers 22 and 23 using a same mask. Alternately, the layers 22 and 23 may be patterned separately.

Figure 8:
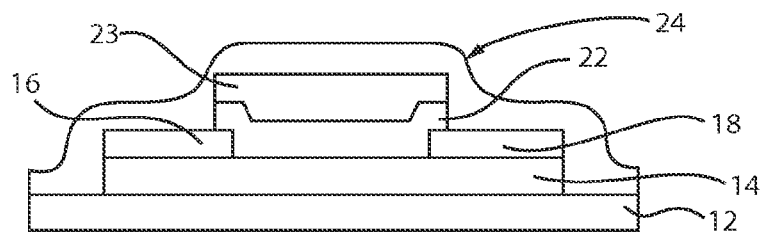
FIG. 8 is a cross-sectional view showing the structure of FIG. 7 having a passivation layer formed over the gate stack and source/drain regions in accordance with the present principles.

Referring to FIG. 8, the passivation layer 24 is formed over the TFT device. The passivation layer 24 may include, e.g., $SiN_x$, $SiO_x$, $SiO_xN_y$, or any other suitable dielectric material.

Figure 9:
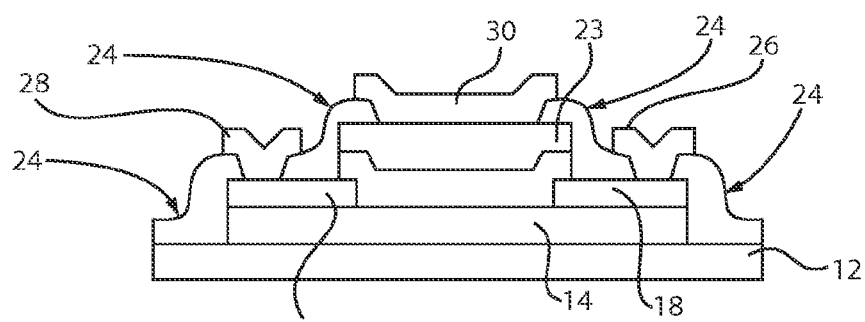
FIG. 9 is a cross-sectional view showing the structure of FIG. 8 having contacts formed through the passivation layer in accordance with the present principles.

Referring to FIG. 9, contacts 26, 28 and 30 are formed along with any other metal structures for the device. The contacts 26, 28 and 30 may be deposited using a sputtering process, although other processes may be employed. The contacts 26, 28 and 30 are then patterned using a masked etch process. As described, additional steps include ITO deposition (e.g., an OLED anode) and formation of edge passivation/smoothening 32. This can include photo-resist reflow and other processes. Next, electroluminescent material is evaporated onto the OLED anode. Other pixel technologies, e.g., LCD, piezoresistive, etc. may also be employed. Other structures and steps may include the concurrent formation of signal, addressing and power lines, and the further formation of capacitors, electrodes, etc.

In accordance with the present principles, employing a crystalline substrate to form the TFT channel results in higher TFT channel mobility and therefore allows sufficient TFT drive current at larger TFT channel lengths. The degradation of the TFT drive current due to large source/drain series resistance is lower at larger TFT channel lengths. As a result, the source drain series resistance is not as critical an issue if a crystalline substrate is used according to the present principles.

The process described employs low-temperature steps (e.g., less than 250° C.). These temperatures are compatible with low-cost substrates such as glass or plastic. CMOS foundry/processing is not necessary despite the use of crystalline substrate materials. Further, using the crystalline substrate enables higher resolution displays. For example, higher mobility is provided. This permits the use of pixels with smaller dimensions since the higher mobility permits sufficient drive current using TFTs with shorter channel widths (better resolution). In addition, higher mobility permits sufficient drive currents using TFTs with larger channel lengths thus reducing lithography costs. Furthermore, higher drive currents resulting from higher mobility reduce voltage requirements for driving the TFTs, which lowers power consumption.

Figure 10:
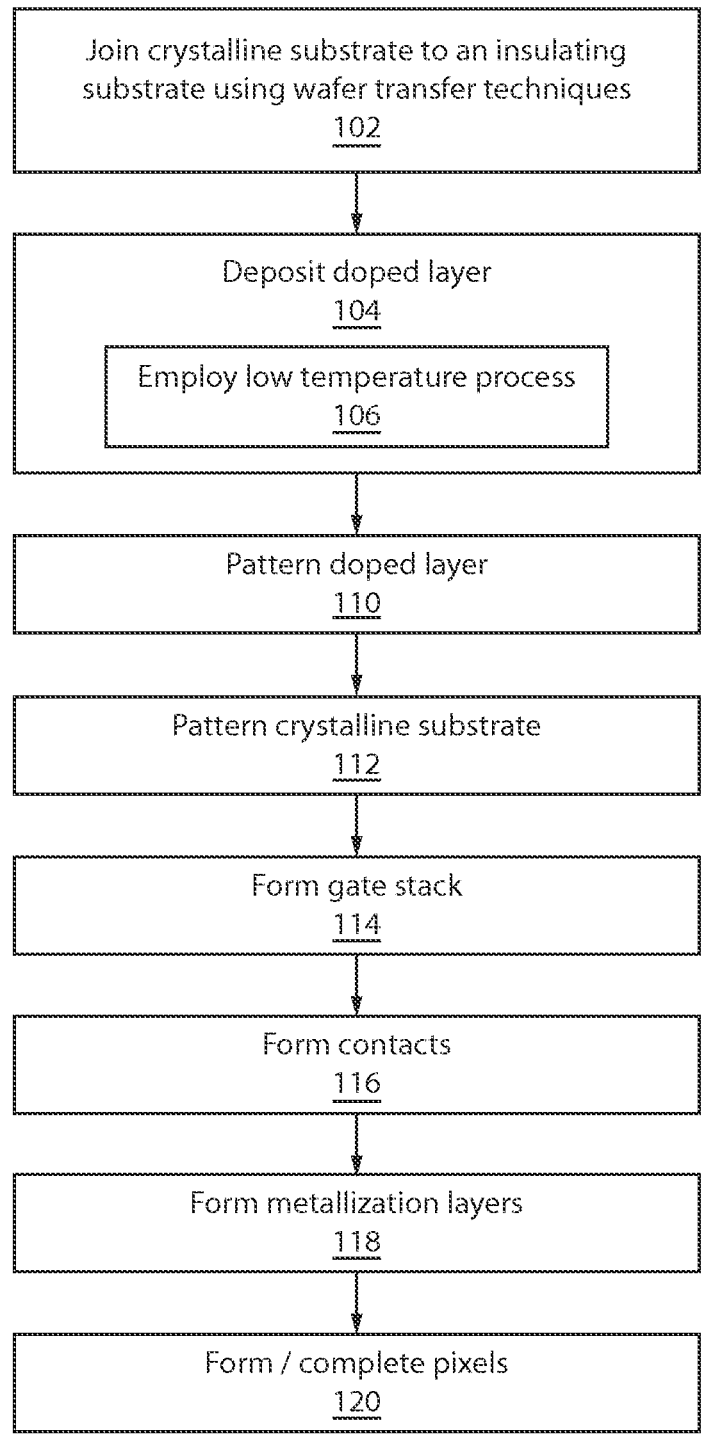
FIG. 10 is a block/flow diagram showing an illustrative method for forming a TFT with a crystalline channel in accordance with one illustrative embodiment.

Referring to FIG. 10, methods for forming TFTs for display devices are illustratively shown. The following method steps are preferably performed in their entirety without exceeding 250 degrees C. It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In block 102, a crystalline substrate is joined to an insulating substrate (e.g., a handle substrate), preferably using a wafer bonding technique. In one embodiment, the insulating layer is formed on a thick crystalline substrate, and a portion of the thick crystalline substrate is removed to form a thin crystalline layer for the crystalline substrate joined to the insulating substrate. Removing the portion of the thick substrate may include cleaving (e.g., spalling, smart cut, epitaxial layer lift-off, etc.) or etching.

In block 104, a doped layer is deposited on the crystalline substrate. In block 106, this may include depositing the doped layer by a plasma enhanced chemical vapor deposition process having a deposition temperature less than 250 degrees C. Alternately, a HWCVD process may be employed.

In block 110, the doped layer is patterned to form source and drain regions. In block 112, the crystalline substrate is patterned to form an active area such that a conductive channel is formed in the crystalline substrate between the source and drain regions. In block 114, a gate stack is formed between the source and drain regions. The gate stack may include a high dielectric constant (high-K) gate dielectric and a metal gate conductor.

In block 116, contacts are formed to the source and drain regions and the gate stack through a first passivation layer. In block 118, one or more metallization layers are formed to provide lines for connecting components and for forming the components themselves, for example, capacitor electrodes, pixel electrodes, etc. These components may be formed or partially formed during contact formation in block 116. In block 120, a transparent conductor is deposited and patterned on the insulating substrate to form pixel electrodes. In one embodiment, electroluminescent material is formed on the electrodes to form a light emitting diode pixel. The pixel electrodes may be employed in liquid crystal displays or other active matrix displays. The electrodes may be completed by forming a second electrode. Processing continues to complete the display device.

Having described preferred embodiments for crystalline thin-film transistors (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a thin film transistor, comprising:
    joining a crystalline substrate to an insulating substrate by layer transfer and bonding;
    depositing a doped layer on an entire upper surface of the crystalline substrate after said joining of the crystalline substrate to the insulating substrate;
    patterning the doped layer after said depositing the doped layer on the crystalline substrate to remove the portion of the doped layer that is present directly on a channel portion of the crystalline substrate, and to form source and drain regions, wherein an active area such that a conductive channel is formed in the crystalline substrate between the source and drain regions;
    forming a gate stack between the source and drain regions; and
    forming contacts to the source and drain regions and the gate stack through a passivation layer.

2. The method as recited in claim 1, wherein joining a crystalline substrate includes forming the insulating layer on a thick crystalline substrate and removing a portion of the thick crystalline substrate to form a thin crystalline layer for the crystalline substrate joined to the insulating substrate.

3. The method as recited in claim 2, wherein removing includes cleaving or etching the thick substrate.

4. The method as recited in claim 1, wherein depositing a doped layer on the crystalline substrate includes depositing the doped layer by a plasma enhanced chemical vapor deposition process having a deposition temperature less than 250 degrees C.

5. The method as recited in claim 1, wherein the method is performed in its entirety without exceeding 250 degrees C.

6. The method as recited in claim 1, wherein forming a gate stack includes forming a high dielectric constant (high-K) gate dielectric and a metal gate conductor.

7. A method for forming a thin film transistor for displays, comprising:
    joining a crystalline substrate to an insulating substrate by layer transfer and bonding;
    depositing a doped layer on an entire upper surface of the crystalline substrate after said joining a crystalline substrate to the insulating substrate;
    patterning the doped layer after said depositing the doped layer on the crystalline substrate to remove the portion of the doped layer that is present directly on a channel portion of the crystalline substrate and to form source and drain regions;

patterning the crystalline substrate to form an active area such that a conductive channel is formed in the crystalline substrate between the source and drain regions;

forming a gate stack between the source and drain regions;

forming contacts to the source and drain regions and the gate stack through a first passivation layer;

forming one or more metallization layers to provide lines for connecting components; and depositing and patterning a transparent conductor on the insulating substrate to form pixel electrodes.

8. The method as recited in claim 7, wherein joining a crystalline substrate includes forming the insulating layer on a thick crystalline substrate and removing a portion of the thick crystalline substrate to form a thin crystalline layer for the crystalline substrate joined to the insulating substrate.

9. The method as recited in claim 8, wherein removing includes cleaving or etching the thick substrate.

10. The method as recited in claim 7, wherein depositing a doped layer on the crystalline substrate includes depositing the doped layer by a plasma enhanced chemical vapor deposition process having a deposition temperature less than 250 degrees C.

11. The method as recited in claim 7, wherein the method is performed in its entirety without exceeding 250 degrees C.

12. The method as recited in claim 7, wherein forming a gate stack includes forming a high dielectric constant (high-K) gate dielectric and a metal gate conductor.

13. The method as recited in claim 7, wherein depositing and patterning a transparent conductor on the insulating substrate to form pixel electrodes includes forming electroluminescent material on the electrodes to form a light emitting diode pixel.

14. The method as recited in claim 7, wherein the pixel electrodes are employed in a liquid crystal display.

15. The method of claim 1, wherein the doped layer that is deposited on the crystalline substrate is nanocrystalline silicon or microcrystalline silicon.

16. The method of claim 7, wherein the doped layer that is deposited on the crystalline substrate is nanocrystalline silicon or microcrystalline silicon.

17. The method of claim 1, wherein the method is performed in its entirety without exceeding 200 degrees C.

18. The method of claim 7, wherein the method is performed in its entirety without exceeding 200 degrees C.

19. The method of claim 1 further comprising forming a contact form the drain region to an electrode of a pixel of a display, wherein the thin film transistor is a driver device for the pixel of the display.

20. The method of claim 7, wherein the thin film transistor is a driver device for a pixel of the display.

\* \* \* \* \*